US009502337B2

(12) United States Patent
Shi

(10) Patent No.: US 9,502,337 B2
(45) Date of Patent: Nov. 22, 2016

(54) FLIP-CHIP ON LEADFRAME SEMICONDUCTOR PACKAGING STRUCTURE AND FABRICATION METHOD THEREOF

(71) Applicant: NANTONG FUJITSU MICROELECTRONICS CO., LTD., Nantong (CN)

(72) Inventor: Lei Shi, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 14/926,649

(22) Filed: Oct. 29, 2015

(65) Prior Publication Data

US 2016/0126166 A1    May 5, 2016

(30) Foreign Application Priority Data

Oct. 31, 2014  (CN) .................. 2014 1 0606692
Oct. 31, 2014  (CN) .................. 2014 1 0606760
Oct. 31, 2014  (CN) .................. 2014 1 0607362

(51) Int. Cl.
  *H01L 23/495*   (2006.01)
  *H01L 21/48*    (2006.01)
  *H01L 21/56*    (2006.01)
  (Continued)

(52) U.S. Cl.
  CPC ...... *H01L 23/49558* (2013.01); *H01L 21/4825* (2013.01); *H01L 21/4835* (2013.01); *H01L 21/561* (2013.01); *H01L 21/565* (2013.01); *H01L 21/78* (2013.01); *H01L 23/3114* (2013.01); *H01L 23/49575* (2013.01); *H01L 24/14* (2013.01); *H01L 24/17* (2013.01); *H01L 24/81* (2013.01); *H01L 23/49582* (2013.01); *H01L 2021/60022* (2013.01); *H01L 2924/18161* (2013.01)

(58) Field of Classification Search
  CPC ..... H01L 24/13; H01L 24/81; H01L 21/561; H01L 21/563; H01L 23/49582; H01L 23/49575; H01L 24/16; H01L 24/14; H01L 24/17
  See application file for complete search history.

(56) References Cited

U.S. PATENT DOCUMENTS 6,929,981 B2 *  8/2005  Hwee ............... H01L 23/3114
                                                    257/E23.101
8,129,229 B1    3/2012  Sirinorakul et al.
  (Continued)

FOREIGN PATENT DOCUMENTS

CN          103745931 A      4/2014

*Primary Examiner* — Alonzo Chambliss
(74) *Attorney, Agent, or Firm* — Anova Law Group, PLLC

(57) ABSTRACT

Flip-chip on leadframe (FCOL) semiconductor packaging structure and fabrication method thereof are provided. A semiconductor chip with copper pillars formed there-over is provided. A barrier layer is formed on the copper pillars. A solder material is coated on the barrier layer. A layer of soldering flux is coated on the solder material. A leadframe with electric leads formed thereon is provided. An insulating layer is formed an the leadframe and having a plurality of openings to expose portion of the electric leads. The semiconductor chip is placed upside down onto the leadframe to have the soldering flux in contact with the portion of the electric leads exposed in the openings. The solder material flows back to form conductive interconnections between the copper pillars and the portion of the electric leads exposed in the openings. The semiconductor chip is packaged with the leadframe using a mold compound.

18 Claims, 9 Drawing Sheets

(51) Int. Cl.
  *H01L 21/78* (2006.01)
  *H01L 23/31* (2006.01)
  *H01L 23/00* (2006.01)
  *H01L 21/60* (2006.01)

(56) References Cited

U.S. PATENT DOCUMENTS

| | | | | |
|---|---|---|---|---|
| 8,426,255 B2* | 4/2013 | Shen | ............ | H01L 23/4952 257/E21.006 |
| 2008/0093717 A1 | 4/2008 | Huang et al. | | |
| 2009/0072385 A1* | 3/2009 | Alley | ............ | H01L 23/38 257/713 |
| 2009/0289360 A1* | 11/2009 | Takahashi | ......... | H01L 23/49811 257/737 |
| 2011/0266667 A1* | 11/2011 | Wu | ............ | H01L 21/76852 257/737 |
| 2012/0091577 A1* | 4/2012 | Hwang | ............ | H01L 24/11 257/737 |
| 2013/0295762 A1* | 11/2013 | Lu | ............ | H01L 24/11 438/614 |
| 2014/0342546 A1* | 11/2014 | Hwang | ............ | H01L 24/11 438/614 |
| 2015/0228533 A1* | 8/2015 | Hwang | ............ | H01L 24/05 438/613 |

* cited by examiner

FLIP-CHIP ON LEADFRAME SEMICONDUCTOR PACKAGING STRUCTURE AND FABRICATION METHOD THEREOF

CROSS-REFERENCES TO RELATED APPLICATIONS

This application claims the priority of Chinese patent application No. 201410606692.4, filed on Oct. 31, 2014, Chinese patent application No. 201410606760.7, filed on Oct. 31, 2014, and Chinese patent application No. 201410607362.7, filed on Oct. 31, 2014, the entirety of all of which is incorporated herein by reference.

FIELD OF THE INVENTION

The present invention generally relates to the field of semiconductor manufacturing technology and, more particularly, relates to a flip-chip on leadframe (FCOL) semiconductor packaging structure and the fabricating process thereof.

BACKGROUND

As time progresses, semiconductor packaging structures become smaller and smaller and the concentration of the structures keeps increasing. In addition, semiconductor packaging structures have been made in a variety of shapes. Based on the connection method, semiconductor packaging structure has been typically classified as a metal wire bonding type and a flip-chip bonding type. The packaging structure of the metal wire bonding type connects electrodes of a semiconductor chip to a leadframe by using conducting bonding metal wires while for a packaging structure of the flip-chip type, the semiconductor chip is directly connected to the electric leads or connected to connecting terminals of a circuit board through conductive protrusions placed on solder joints of the electrodes of the semiconductor chip. The packaging structure of the flip-chip bonding type has shorter electrical connection paths as compared to the packaging structure of the metal wire bonding type, thus it provides not only excellent thermal and electrical properties but also a smaller size for the packaging structure. Therefore, the flip-chip packaging structure becomes an advanced selection for the modern wireless communication applications in the GHz frequency range.

Currently, during the process of forming a flip-chip on leadframe (FCOL) semiconductor packaging structure, low melting point solder material is usually deposited on the interconnection sites and solder protrusions are formed on the semiconductor chip. The protrusions may also include metal pillars sticking out from solder pads of the semiconductor chip. Each solder pad of the semiconductor chip has a solder ball formed on a free end of the metal pillar. The solder balls are usually made of a high-lead solder material. Further, the solder balls on the chip are flipped together with the semiconductor chip and are placed upside down on the leadframe with the solder balls adjacent to the deposited solder material on interconnection sites.

Then, the temperature is raised. When the temperature reaches a certain point, the deposited solder material melts and flows back. As a result, the solder material adheres to both the interconnection sites on the leadframe and the high-lead solder balls on the copper pillars, thus forming solder connections between the high-lead solder balls on the free ends of the copper pillars and the interconnection sites on the leadframe. Finally, the structure is packaged to an FCOL semiconductor packaging structure.

During the back-flow process, the melt solder is flowable and may be lost from the connection points, leading to poor contacts between the high-lead solder balls on copper pillars and the interconnection sites on the leadframe or undesired contacts between the solder and the neighboring leads, causing short circuits.

In addition, during the packaging process of the FCOL semiconductor packaging structure, the chip will be sealed, thus the heat in the chip may not be conducted out. Traditionally, most FCOL semiconductor packaging structures release the heat in the chip through a carrier board. However, there are still some problems as follows.

First, the chip in a traditional FCOL semiconductor packaging structure is suspended on the carrier board. However, heat cannot be efficiently dissipated from such a suspended chip, thus the electrical and thermal performance and the reliability of the final product may be affected.

Second, most of the traditional semiconductor leadframe-type packages use a metal board in the package component to conduct the heat generated in the chip, thus increasing the area of the carrier board may improve the cooling efficiency. However, due to the difference in the thermal expansion coefficients of different materials, increasing the area of the carrier board to meet the high heat dissipation demands may induce reliability issues such as residual stress, layer segregation, etc. In addition, increasing the area of the carrier board does not meet the requirements of the development trend for increasingly slim and light semiconductor packaging components.

Third, some traditional semiconductor packaging structures also choose to use highly conductive and thermal molding material to improve the cooling efficiency. However, in addition to the cost price of the highly conductive and thermal molding material, using such a material not only has higher requirements for the control of the molding process of the product, but also shows no obvious improvement on the cooling effect. The disclosed device structures and methods are directed to solve one or more problems set forth above and other problems.

BRIEF SUMMARY OF THE DISCLOSURE

The present disclosure includes a method for fabricating a flip-chip on leadframe (FCOL) semiconductor packaging structure by providing a semiconductor chip with a solder pad pattern formed on the semiconductor chip and a plurality of copper pillars formed on the solder pad pattern. A barrier layer is formed on the copper pillar. A predetermined amount of solder material is coated on the barrier layer. A layer of soldering flux is coated on the solder material. A leadframe with electric leads formed on the leadframe is provided. An insulating layer is formed on the leadframe and having a plurality of openings, positioned corresponding to the copper pillars, to expose a portion of the electric leads. The semiconductor chip is placed upside down onto the leadframe to have the soldering flux in contact with the portion of the electric leads exposed in the openings. The solder material flows back to form conductive interconnections between the copper pillars and the portion of the electric leads exposed in the openings. The semiconductor chip is packaged with the leadframe using a mold compound.

The present disclosure flintier includes an FCOL semiconductor packaging structure. The FCOL semiconductor packaging structure includes a semiconductor chip with a solder pad pattern formed on the semiconductor chip, a plurality of copper pillars formed on the solder pad pattern, a leadframe with electric leads formed on the leadframe, and an insulating layer covering the leadframe. The insulating layer includes a plurality of openings formed there-in with a portion of the electric leads exposed in each opening, a position of each opening corresponding to a position of a copper pillar, and an area of each opening is larger than a cross-section area of the corresponding copper pillar. The FCOL semiconductor packaging structure also includes a plurality of solder interconnections with each solder interconnection located between a copper pillar and electric leads exposed in the corresponding opening of the copper pillar, and mold compound used to packaging the semiconductor chip, the plurality of copper pillars, the leadframe, the insulating layer, and the plurality of solder interconnections.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings.

As described above in the background section, under current technology, in the packaging process, the melt solder is flowable and may be lost from the connection points, leading to poor contacts between the high-lead solder balls on copper pillars and the interconnection sites on the leadframe or undesired contacts between the solder material and the neighboring leads, resulting in short circuits. In view of the above deficiencies, the present disclosure provides an improved method for forming FCOL semiconductor packaging structures.

In the following, detailed description of exemplary embodiments will be given with reference drawings. For convenience of description, only a portion of the leadframe and the semiconductor chip is shown in the reference drawings. However, the formation process for FCOL semiconductor packages described in the present disclosure may be used in general to form connections between all copper pillars on semiconductor chips and all connection sites on leadframes in FCOL semiconductor packages.

Figure 1:
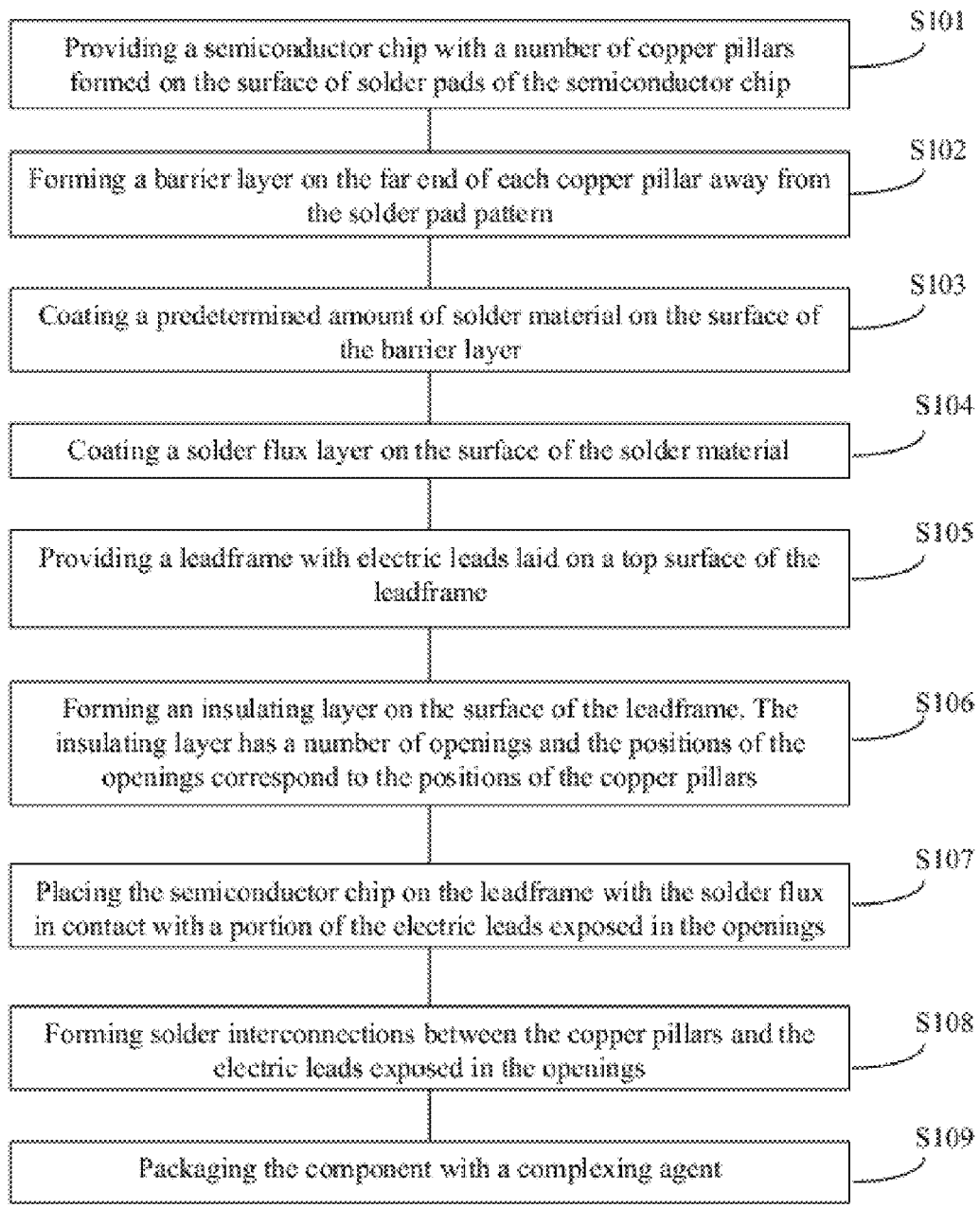
FIG. 1 illustrates an exemplary fabrication process of an FCOL semiconductor packaging structure in one embodiment of the present disclosure.

FIG. 1 shows a fabrication flow chart of an exemplary fabrication process.

Figure 2A:
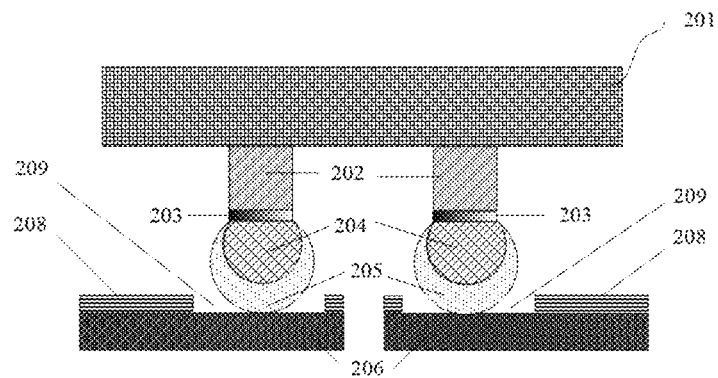
FIGS. 2A-2C illustrate schematic cross-section views of a leadframe and semiconductor chip corresponding to certain stages of an exemplary fabrication process consistent with disclosed embodiments.

As shown in FIGS. 1 and 2A, at the beginning of the process, a semiconductor chip 201 is provided. A number of copper pillars 202 have been formed on the surface of solder pads of the semiconductor chip 201 (S101).

Referring to FIG. 2A, a number of copper pillars 202 stick out from solder pads (not shown) of the semiconductor chip 201. The copper pillars 202 on the semiconductor chip 201 may be formed by using any known methods in the field for fabricating protrusions on wafer surfaces. In the present embodiment, the height of the copper pillars 202 may be in a range of 10 μm-90 μm while the diameter of the copper pillars 202 may be in a range of 20 μm-150 μm. Controlling the height of the copper pillars 202 may ensure a relatively high product finished rate.

Further, a barrier layer 203 may be formed on the far end of the copper pillar 202 away from the solder pads on the semiconductor chip 201 (S102).

In one embodiment, the barrier layer 203 may be coated on the far end of each copper pillar 202 away from the solder pad pattern by using an electroplating method. The barrier layer 203 is usually made of Ni.

Then, a predetermined amount of solder material 204 may be coated on the surface of the barrier layer 203 (S103).

The solder material 204 may be coated by any appropriate methods used in semiconductor industry. Referring to FIG. 2A, in one embodiment, the solder material 204 is electroplated or attached on the surface of the copper pillar 202 away from the solder pad pattern as a solder ball. The amount of solder material coated on the barrier layer 203 of each copper pillar is predetermined. Regardless of the fabrication process adopted to coat the solder material, the process must ensure that the predetermined amount of solder material s coated on each of the barrier layer 203.

In one embodiment, an electroplating process is adopted. As compared to a solder printing process, the electroplating process has a low process variation, thus the process may ensure an easy control of the coated amount of the solder material and allow a uniform distribution of the solder material across the semiconductor chip 201.

The coated amount of the solder material may be determined by a variety of factors including the type of the solder material 204, the diameter or the cross-section area of the copper pillar 202, the area of opening 209, the quality of the semiconductor chip 201, the number of the copper pillars 202, the shape of the back-flowing solder material 204 during the back-flow process, the intended final dimensions of the back-flowing solder material 204 and the copper pillar 202, the type of soldering flux 205, etc. During the back-flow process, when the solder material 204 is melt, these adjustable parameters of the solder material may favorably allow the coated solder material 204 stay in the regions around the copper pillars 202 and the openings 209.

In one embodiment, the height of the solder material 204 may be in a range of 10 μm-45 μm, for example, about 35 μm. The height of the solder material 204 determines the height of the solder interconnections 210 (see FIG. 2B) after the back-flow process.

Further, a layer of soldering flux 205 may be coated on the surface of the solder material 204 (S104).

Referring to FIG. 2A, in one embodiment, the coated soldering flux 205 covers the entire surface of the solder ball made of solder material 204. The soldering flux 205 is coated by temporarily dipping the semiconductor chip 201 with solder material 204 on the surface into a reservoir of soldering flux 205. When temperature is raised, the soldering flux 205 cleans the surface it covers, thus enhances the adhesive ability of the solder material 204. The surface cleaned includes the surface area of the solder material 204 and the surface area of the leadframe exposed in the openings 209.

Further, a leadframe 206 is provided and the leadframe 206 has electric leads on the surface (S105).

Then, an insulating layer 208 may be formed on the surface of the leadframe 206 and the insulating layer 208 has a number of openings 209 formed in the layer in positions corresponding to the positions of the copper pillars 202 (S106). In each opening 209, a portion of the electric leads (not shown) is exposed.

Referring to FIG. 2A, the surface area of the openings 209 is larger than the cross-section area of the copper pillars 202. The thickness of the insulating layer 208 may be in a range of 5 μm-10 μm. The insulating layer 208 may cover all the electric leads or may include multiple discrete sections with each section having the openings 209 to expose a portion of the electric leads. The discrete sections of the insulating layer 208 may have a circular or square shape. In one embodiment, the insulating layer 208 may be made of any appropriate insulating material for FCOL packaging, such as polyimide or high-temperature insulating materials. The insulating layer 208 may be made by any appropriate process for forming insulating layers.

Further, the semiconductor chip 201 may be flipped and placed upside down on the leadframe 206 with the soldering flux 205 contacting the exposed electric leads in the openings 209 (S107).

Referring to FIG. 2A, in one embodiment, the soldering flux 205 wets or adheres to the portion of the electric leads exposed in the openings 209 and the structure is now ready for performing a back-flow process. FIG. 2A illustrates the semiconductor structure prior to the back-flow process.

Figure 2B:
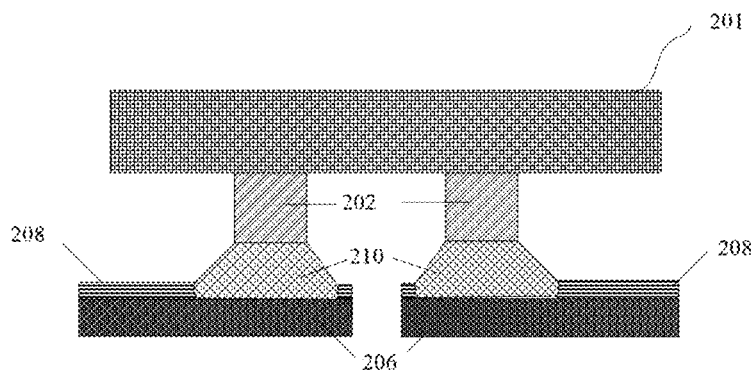

Referring to FIG. 2B, solder interconnections 210 are formed between the copper pillars 202 and the portion of the electric leads exposed in the openings 209 by back-flowing the solder material 204 between the semiconductor chip 201 and the leadframe component (also referred to component) (S108). FIG. 2B illustrates the structure after forming the solder interconnections 210.

Referring to FIG. 2B, during the heating and black-flowing process, the soldering flux cleans the portion of electric leads exposed in the openings 209 on the leadframe 206. The solder material 204 starts melting. The melt, solder material 204 flows onto the cleaned surface of the portion of the leadframe 206 exposed in the openings 209 and adheres to the portion of the electric leads exposed in the openings 209. Thus, the solder interconnections 210 are formed between the copper pillars 202 and the portion of the electric leads exposed in the corresponding openings 209. The predetermined amount of the solder material 204 decides the formation of the solder interconnections 210, and the openings 209 further confine the flow of the solder material 204 to ensure the solder material 204 remain in the region within the openings 209.

The diameter (or a width or an equivalent) of the end surface of the solder interconnections 210 close to the semiconductor chip 201 side may be in a range of 20 μm-150 μm while the diameter or a width or an equivalent) of the end surface of the solder interconnections 210 away from the semiconductor chip 201 may be in a range of 30 μm-200 μm.

Figure 2C:
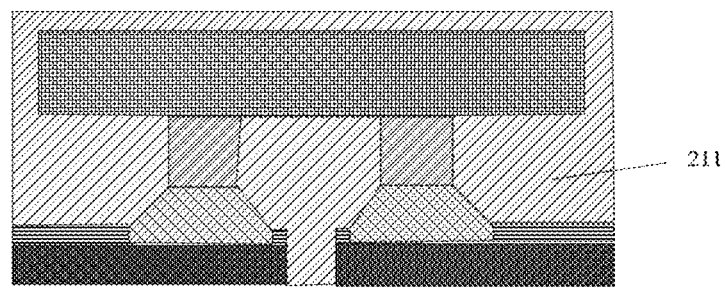

Finally, the leadframe component may be packaged by using a mold compound (S109). FIG. 2C shows the corresponding semiconductor structure after packaging.

Referring to FIG. 2C, after the back-flow process, the leadframe component may further be cleaned to remove a potential excess of soldering flux 205 when a regular soldering flux is used. Then, a mold compound 211 may be used to encapsulate the leadframe component to form FCOL, semiconductor package (not shown). Moreover, when soldering flux 205 is used without being cleaned, the cleaning process may be optional and omitted. Finally, the Fall, semiconductor packages may be singulated or otherwise separated from the leadframe component. In addition, prior to the singulation process, extra processes such as forming external electric leads and testing the performance of the semiconductor chip may be performed.

The present disclosed method effectively reduces the loss of the solder material 204 from the connection sites, thus improves the coupling between the copper pillars 202 and the leadframe 206 and reduces non-ideal contacts and also reduces short circuits between electric leads. In addition, the disclosed method also increases the amount of the solder material 204 remained in the openings 209, to enhance mechanical strength of the coupling between the copper pillars 202 and the leadframe 206, ensuring the fabrication of more reliable electrical connections.

In another embodiment, comparing to the structures and methods shown in FIGS. 2A-2C, prior to forming the insulating layer 208 on the surface of the leadframe 206, a silver-containing layer 207 may be electroplated or printed onto the surface of the leadframe 206. For example, FIG. 3A illustrates a schematic cross-section view of the leadframe and the semiconductor chip prior to the back-flow process in the second embodiment.

Figure 3A:
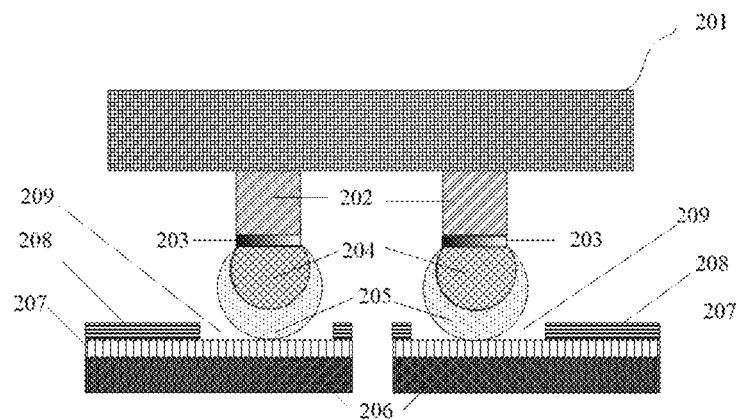
FIGS. 3A-3C illustrate schematic cross-section views of another leadframe and semiconductor chip corresponding to certain stages of an exemplary fabrication process consistent with disclosed embodiments.
Figure 3B:
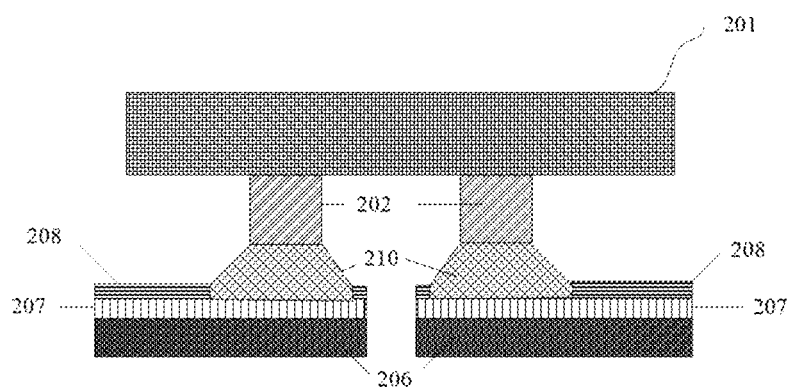
Figure 3C:
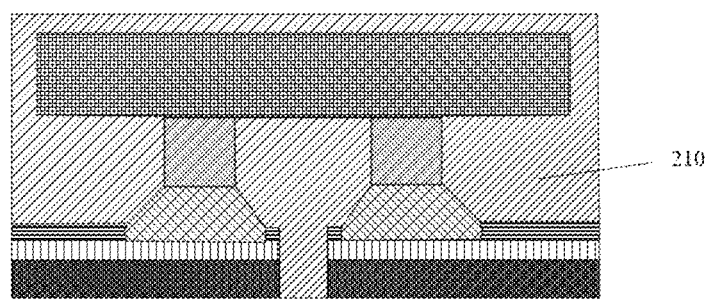

Referring to FIGS. 3A-3C, various embodiments thus include an additional process to form the silver-containing layer 207, such as a silver or silver alloy layer, on the leadframe 206 to cover the entire or a portion of the electric leads before the formation of the insulating layer 208.

When the silver-containing layer 207 in FIGS. 3A-3C only partially covers the electric leads, the silver-containing layer 207 may include multiple sections covering discrete portions of the electric leads and the positions of the multiple discrete sections correspond to the positions of the copper pillars 202. The area of the silver-containing layer 207 is greater or equal to the area of the openings 209 to be formed in the insulating layer 208 in a subsequent process. The discrete sections of the silver-containing layer 207 may have a circular or square shape.

In one embodiment, the silver-containing layer 207 is made of silver and covers all the electric leads. The silver-containing layer 207 may improve adhesion between the leadframe 206 and the copper pillars 202, thus prevent the loss of the solder material from the connection sites. In other embodiments, using silver alloy for the silver-containing layer 207 may also prevent the loss of the solder material.

Other structure components and their method illustrated in FIGS. 3A-3C may be substantially the same or similar to those described in FIGS. 2A-2C.

In another embodiment, comparing to the structures and methods shown in FIGS. 2A-2C, an insulating layer 208 only partially covers the surface of the leadframe 206, and after forming the insulating layer 208 on the leadframe 206, a tin-containing layer 207a may be electroplated or printed in the openings 209 formed in the insulating layer 208. For example, FIG. 4A illustrates a schematic cross-section view of the leadframe and the semiconductor chip prior to the back-flow process in the third embodiment.

Figure 4A:
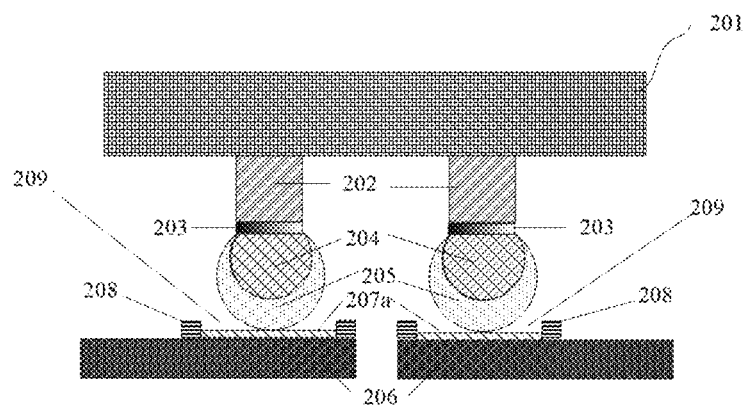
FIGS. 4A-4C illustrate schematic cross-section views of another leadframe and semiconductor chip corresponding to certain stages of an exemplary fabrication process consistent with disclosed embodiments.
Figure 4B:
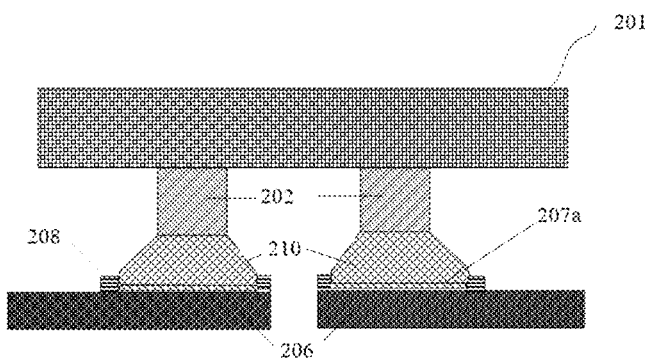
Figure 4C:
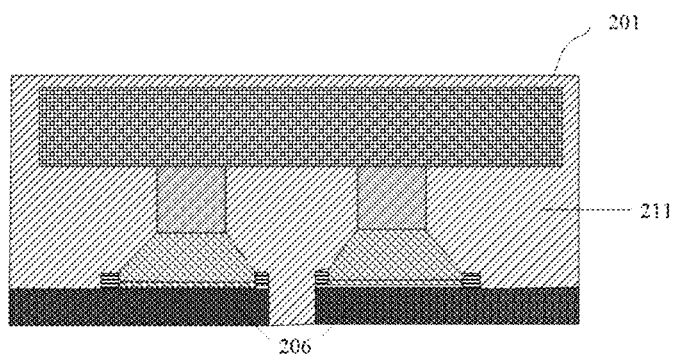

Referring to FIGS. 4A-4C, various embodiments thus include an additional process to form the tin-containing such as a tin or tin alloy layer 207a in the openings 209 after forming the insulating layer 208 on the leadframe 206. The thickness of the tin-containing layer 207a is smaller than that of the insulating layer 208. In one embodiment, the tin-containing layer 207a may improve adhesion between the leadframe 206 and the copper pillars 202, thus prevent the loss of the solder material from the connection sites. In other embodiments, using a tin alloy layer to replace the tin layer and/or having the insulating layer 208 entirely covering the surface of the leadframe 206 may also prevent the loss of the solder material.

Other structure components and their methods illustrated in FIGS. 4A-4C may be substantially the same or similar to those described in FIGS. 2A-2C and/or FIGS. 3A-3C.

As illustrated in FIGS. 2A-2C, FIGS. 3A-3C, and/or FIGS. 4A-4C, the non-active surfaces of the semiconductor chip 201 are covered by mold compound 211. In other embodiments, the non-active surface of the semiconductor chip 201 may be exposed by incorporating additional procedures before and after the packaging process. In the following, an additional exemplary embodiment is provided to illustrate these additional procedures.

Figure 5:
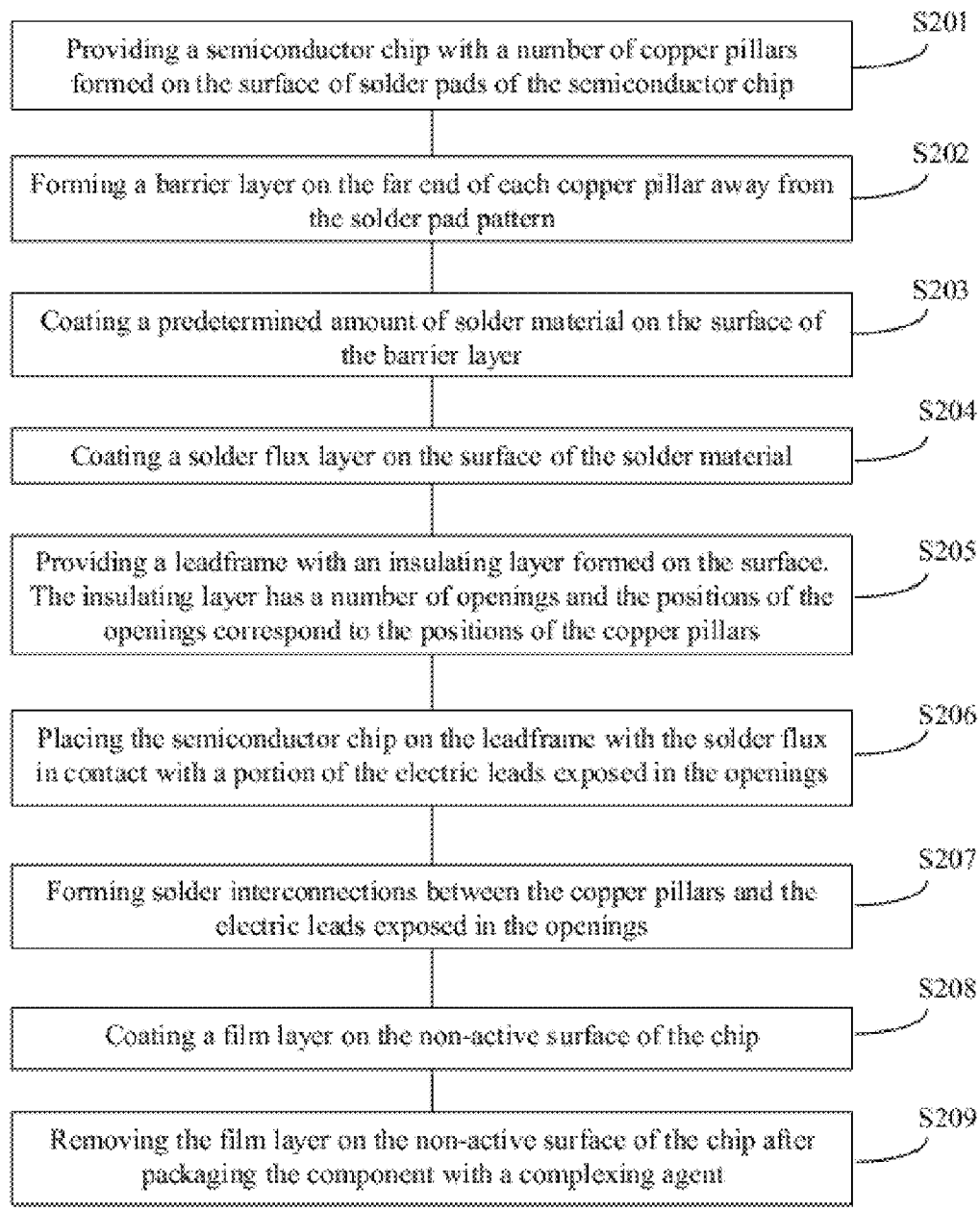
FIG. 5 illustrates an exemplary fabrication process of an FCOL semiconductor packaging structure consistent with disclosed embodiments.

FIG. 5 illustrates the fabrication process of a FCOL semiconductor packaging structure according to the present disclosure. FIGS. 6A-6D show schematic cross-section views of a leadframe and a semiconductor chip corresponding to certain stages of the fabrication process consistent with various disclosed embodiments.

Figure 6A:
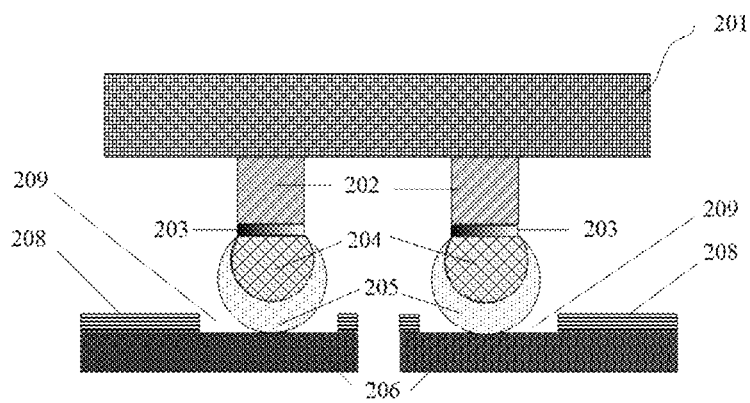
FIG. 6A-6D illustrate schematic cross-section views of another leadframe and semiconductor chip corresponding to certain stages of an exemplary fabrication process consistent with disclosed embodiments.

Referring to FIG. 5 and FIG. 1, at the beginning of the fabrication process, the processes may be similar. FIG. 6A shows a semiconductor structure obtained after performing fabrication steps S201-S206 in one embodiment. The structure shown in FIG. 6A is identical to the semiconductor structure in FIG. 2A after performing fabrication steps S101-S107.

Then, solder interconnections 210 are formed between the copper pillars 202 and the portion of the electric leads exposed in the openings 209 by back-flowing the solder material 204 between the semiconductor chip 201 and the leadframe component (S207).

Figure 6B:
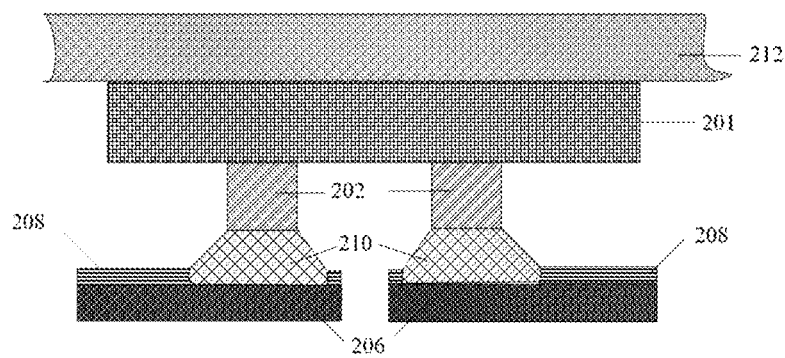

After the back-flow process, a film layer 212 may be coated on the non-active surface of the semiconductor chip 201 (S208). FIG. 6B shows a schematic cross-section view of the leadframe and the semiconductor chip after the film layer 212 is coated on non-active surface of the semiconductor chip 201.

The film layer 212 may be made of any appropriate resin material. The thickness of the film layer 212 may not be thinner than one third of the thickness of the semiconductor chip 201. For example, a thickness of the film layer 212 is greater than the half of the thickness of the semiconductor chip 201.

Figure 6C:
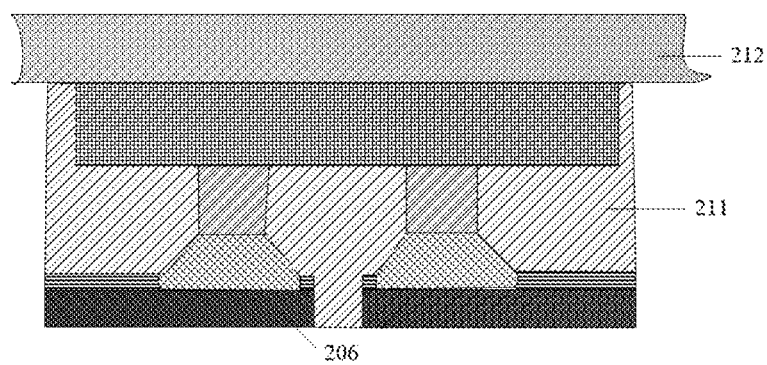
Figure 6D:
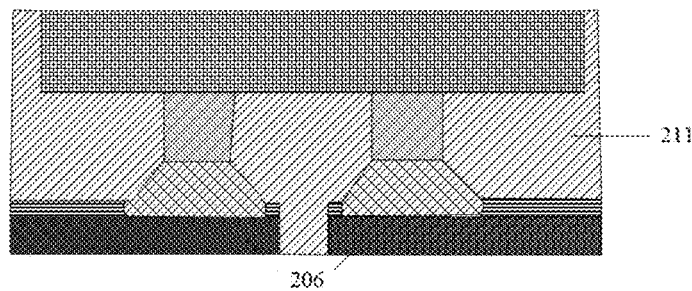

Then, the leadframe component may be packaged by using a mold compound and the film layer 212 is then removed to form a FCOL semiconductor packaging structure with an uncovered non-active chip surface (S209). FIG. 6C shows a schematic cross-section view of the leadframe component after the packaging process and FIG. 6D shows a schematic cross-section view of the complete FCOL semiconductor packaging structure with an uncovered non-active chip surface.

In other embodiments, similar procedures, including coating a film layer on the non-active surface of the chip prior to the packaging process and removing the film layer after the packaging process, may also be adopted to release the non-active surface of the semiconductor chip 201 in the ultimately-fabricated FCOL semiconductor packaging structure.

Figure 7A:
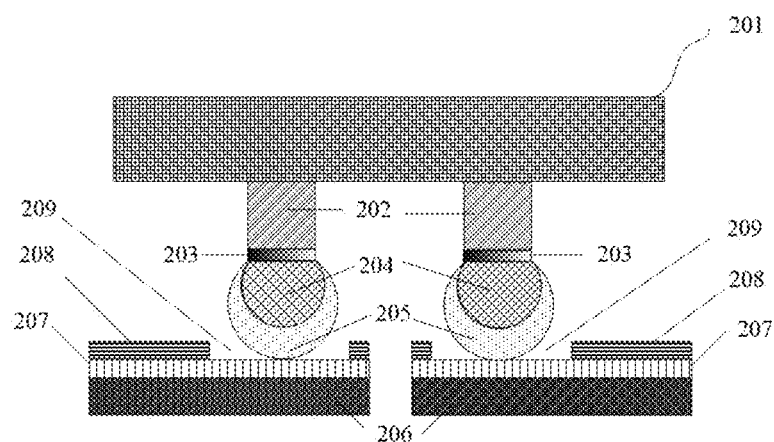
FIGS. 7A-7D illustrate schematic cross-section views of another leadframe and semiconductor chip corresponding to certain stages of an exemplary fabrication process consistent with disclosed embodiments.
Figure 7B:
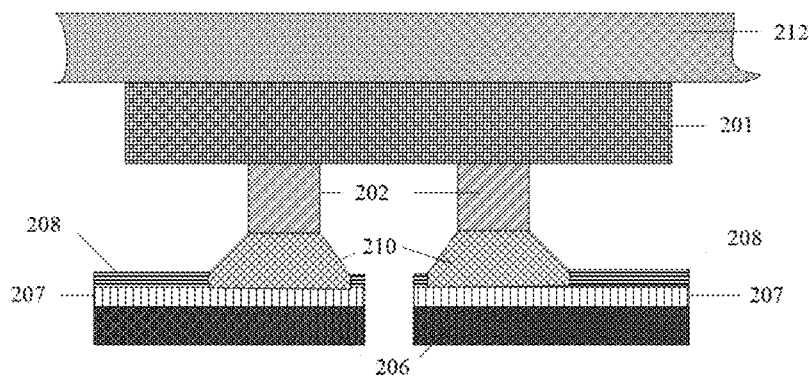
Figure 7C:
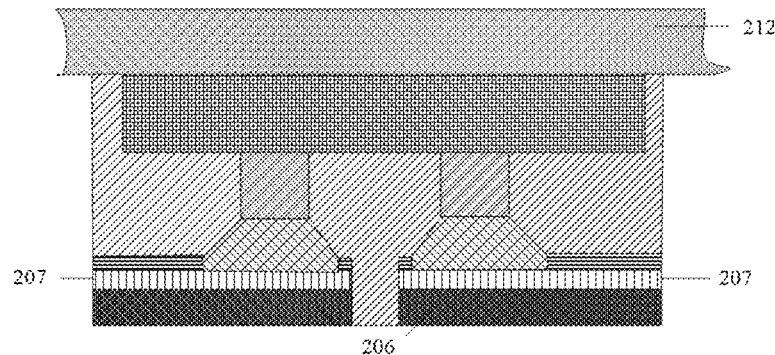

In another embodiment, based on the fabrication process shown in FIG. 5, prior to the formation of the insulating layer 208 on the surface of the leadframe 206, a silver-containing layer 207 may be electroplated or printed onto the surface of the leadframe 206. FIG. 7A illustrates a schematic cross-section view of the leadframe and the semiconductor chip prior to the back-flow process.

When the silver-containing layer 207 only partially covers the electric leads, the silver-containing, layer 207 may include multiple sections covering discrete portions of the electric leads and the positions of the multiple discrete sections corresponding to the positions of the copper pillars 202. The area of the silver silver-containing layer 207 is greater or equal to the area of the openings 209 to be formed in the insulating layer 208 in a subsequent process. The discrete sections of the silver-containing layer 207 may have a circular or square shape. In one embodiment, the silver-containing layer 207 is made of silver and covers all the electric leads. The silver-containing layer 207 may improve the adhesion between the leadframe 206 and the copper pillars 202, thus prevent the loss of the solder material from the connection sites. In other embodiments, using silver alloy for the silver-containing layer 207 may also prevent the loss of the solder material.

Other structure components and their methods illustrated in FIGS. 7A-7D may be substantially the same or similar to those described above.

Figure 8A:
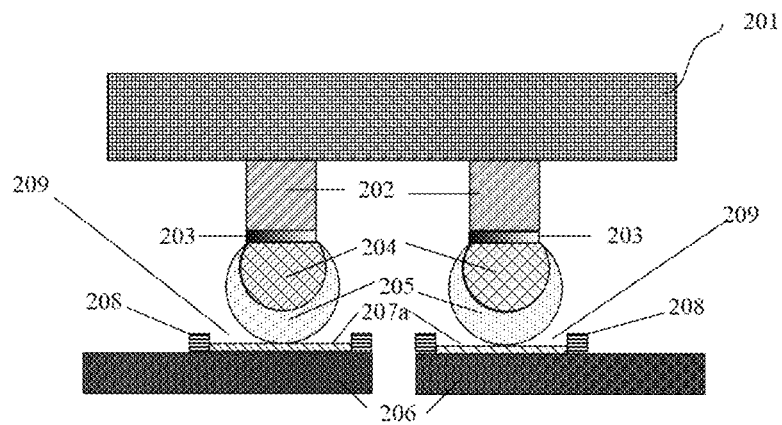
FIGS. 8A-8D illustrate schematic cross-section views of another leadframe and semiconductor chip corresponding to certain stages of an exemplary fabrication process consistent with disclosed embodiments.
Figure 8B:
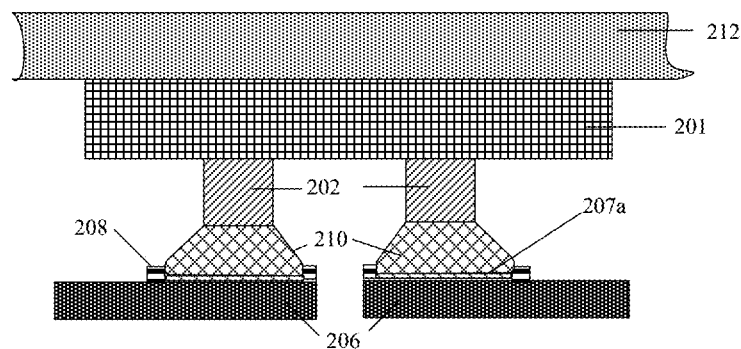
Figure 8C:
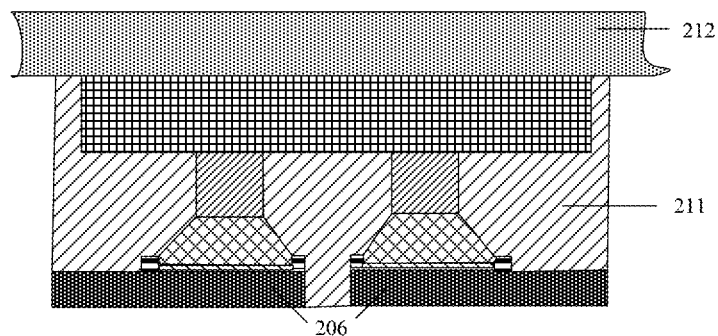

In another embodiment, based on the fabrication process shown in FIG. 5, an insulating layer 208 only partially covers the surface of the leadframe 206, and after forming the insulating layer 208 on the leadframe 206, a tin-containing layer 207a may be electroplated or printed in the openings 209 formed in the insulating layer 208. FIG. 8A illustrates a schematic cross-section view of the leadframe and the semiconductor chip prior to the back-flow process.

Referring to FIGS. 8A-8D, various embodiments thus include an additional process to form a tin-containing layer 207a in the openings 209 after the formation of the insulating layer 208 on the leadframe 206. The thickness of the tin-containing layer 207a is smaller than that of the insulating layer 208. In one embodiment, the tin-containing layer 207a is made of tin a id the tin layer 207a may improve the adhesion between the leadframe 206 and the copper pillars 202, thus prevent the loss of the solder material from the connection sites. In other embodiments, using a tin alloy layer to replace the tin layer and/or having the insulating layer 208 entirely cover the surface of the leadframe 206 may also prevent the loss of the solder material.

Other structure components and their methods illustrated in FIGS. 8A-8D may be substantially the same or similar to those described above.

The present disclosure also provides a FCOL semiconductor packaging structure. FIG. 2C shows a schematic cross-section view of the FCOL semiconductor packaging structure. Referring to FIG. 2C, the FCOL semiconductor packaging structure includes:

a semiconductor chip 201 with a solder pad pattern formed on the surface of the semiconductor chip 201; and a number of copper pillars 202 formed on the top of the solder pad pattern; and a leadframe 206 with electric leads formed on the surface of the leadframe; and an insulating layer 108 covering the surface of the leadframe 206; and a number of openings (not shown) formed in the insulating layer with a portion of the electric leads exposed in each opening; the position of each opening corresponding to the position of a copper pillar 202; and the area of each opening is larger than the cross-section area of the corresponding copper pillar 202; and a number of solder interconnections 210 with each solder interconnection 210 located between a copper pillar 202 and electric leads exposed in the corresponding opening of the copper pillar 202; and mold compound 211 used to packaging the semiconductor chip 201, the number of copper pillars 202 the leadframe 206, the insulating layer 208, and the number of solder interconnections 210.

A number of copper pillars 202 stick out from solder pads (not shown) of the semiconductor chip 201. The copper pillars 202 on the semiconductor chip 201 may be formed by using any known methods in the field for fabricating protrusions on wafer surfaces. In the present embodiment, the height of the copper pillars 202 may be in a range of 10 μm-90 μm while the diameter of the copper pillars 202 may be in a range of 20 μm-150 μm. Controlling the height of the copper pillars 202 may ensure a relatively high product finished rate.

An insulating layer 208 is formed on the surface of the leadframe 206 and the insulating layer 208 having multiple openings for further formation of solder interconnections 210. The surface area of the openings is larger than the cross-section area of the copper pillars 202. The thickness of the insulating layer 208 may be in a range of 5 μm-10 μm. The insulating layer 208 may cover all the electric leads or may include multiple discrete sections with each section having the openings to expose a portion of the electric leads. The discrete sections of the insulating layer 208 may have a circular or square shape. The insulating layer 208 may be made of any appropriate insulating, material for FCOL packaging, such as polyimide or high-temperature insulating materials. The insulating layer 208 may be made by any appropriate process for forming insulating layers.

Solder interconnections 210 are formed between the copper pillars 202 and the electrical leads exposed in the openings of the insulating layer 208 corresponding to the copper pillars 202. The formation of the solder interconnections 210 are decided by a predetermined amount of solder material. The amount of the solder material to be applied may be determined by a variety of factors including the type of the solder material, the diameter or the cross-section area of the copper pillar 202, the area of the opening, the quality of the semiconductor chip 201, the number of the copper pillars 202, the shape of the back-flowing solder material during the back-flow process, the intended final dimensions of the back-flowing solder material and the copper pillar 202, the type of the soldering flux, etc.

During, the back-flow process, when the solder material is melt, these adjustable parameters of the solder material favorably allow the coated solder material stay in the regions around the copper pillars 202 and the openings. The openings in the insulating layer 208 further limit the loss of solder material and ensure the solder interconnections located at the openings in the insulating layer 208. The structure of the solder interconnections is a cylinder with a hemisphere on the top. The height of the cylindrical part of the solder interconnections is equal to the thickness of the insulating layer 208. The diameter of the end surface of the solder interconnections 210 close to the semiconductor chip 201 may be in a range of 20 μm-150 μm while the diameter of the end surface of the solder interconnections 210 away from the semiconductor chip 201 may be in a range of 30 μm-200 μm.

The FCOL semiconducting packaging component is sealed by mold compound 211. The mold compound may be any appropriate material known in the field.

FIGS. 3C, 4C, 6D. 7D, and SD show schematic cross-section views of FCOL semiconductor packaging structures consistent with other embodiments of the present disclosure.

Referring to FIGS. 3C and 2C, the two FCOL semiconductor packaging structures are similar except that a silver-containing layer 207 is formed on the surface of the leadframe 206 by electroplating or printing. The silver-containing layer 207 may cover the entire or a portion of the electric leads on the surface of the leadframe 206.

When the silver-containing layer 207 only partially covers the electric leads, the layer may include multiple sections covering discrete portions of the electric leads and the positions of the multiple discrete sections correspond to the positions of the copper pillars 202. The area of the silver-containing layer 207 is greater or equal to the area of the openings to be formed in the insulating layer 208 in a subsequent process. The discrete sections of the silver-containing layer 207 may have a circular or square shape. In one embodiment, the layer is made of silver and covers all the electric leads. The silver layer 207 may improve the adhesive force between the leadframe 206 and the copper pillars 202, thus prevent the loss of the solder material from the connection sites. In other embodiments, using silver alloy for the layer 207 may also prevent the loss of the solder material.

Referring to FIGS. 4C and 2C, the two FCOL semiconductor packaging structures are similar except that in the structure shown in FIG. 4C, the insulating layer 208 only partially covers the surface of the leadframe 206 and a tin-containing layer 207a is formed in the openings in the insulating layer 208 by electroplating or printing.

Referring to FIG. 4C, the thickness of the tin-containing layer 207a is smaller than that of the insulating layer 208. In one embodiment, the layer is made of tin and the tin layer 207a may improve the adhesion between the leadframe 206 and the copper pillars 202, thus prevent the loss of the solder material from the connection sites. In other embodiments, using a tin alloy layer to replace the tin layer and/or having the insulating layer 208 entirely cover the surface of the leadframe 206 may also prevent the loss of the solder material.

Figure 7D:
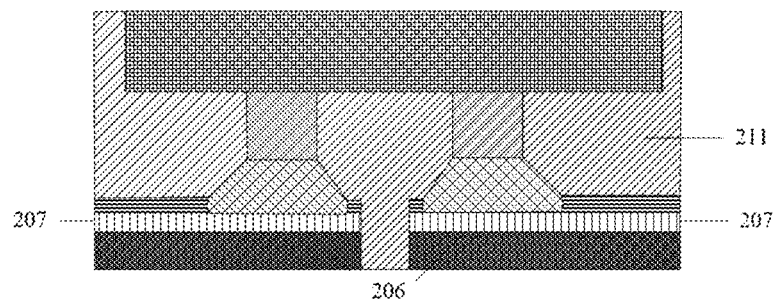
Figure 8D:
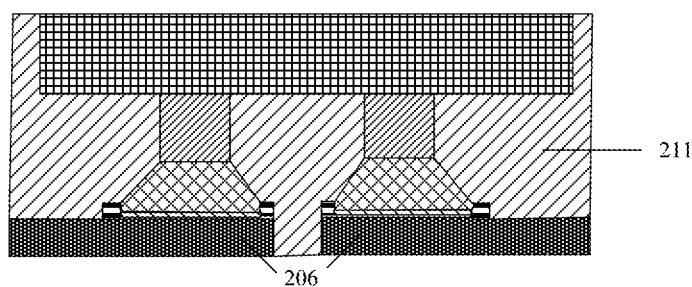

Referring to FIGS. 6D, 7D, and 8D and comparing the figures to FIGS. 2C, 3C, and 4C, respectively, FCOL semiconductor packaging structures consistent with embodiments of the present disclosure may also have the non-active surface of the semiconductor chip 201 exposed. As described above, the non-active surface of the semiconductor chip 201 may be exposed by incorporating additional procedures including coating a film layer on the non-active surface of the semiconductor chip 201 prior to packaging the semiconductor component using mold compound 211 and removing the film layer after the completion of the packaging process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a flip-chip on leadframe (FCOL) semiconductor packaging structure, comprising:
    providing a semiconductor chip with a plurality of copper pillars formed over the semiconductor chip;
    forming a barrier layer on the copper pillar;
    coating a predetermined amount of solder material on the barrier layer;
    coating a layer of soldering flux on the solder material;
    providing a leadframe with electric leads formed on the leadframe;
    forming an insulating layer on the leadframe and having a plurality of openings, positioned corresponding to the copper pillars, to expose a portion of the electric leads;
    placing the semiconductor chip upside down onto the leadframe to have the soldering flux in contact with the portion of the electric leads exposed in the openings;
    flowing back the solder material to form conductive interconnections between the copper pillars and the portion of the electric leads exposed in the openings; and
    packaging the semiconductor chip with the leadframe using a mold compound;
    exposing a non-active surface of the semiconductor chip after the packaging step;
    forming a film layer on the non-active surface of the semiconductor chip prior to the packaging step; and
    removing the film layer to expose the non-active surface of the semiconductor chip after the packaging step.

2. The method according to claim 1 further including a step to determine the predetermined amount of the solder material to be coated, based on a diameter and a cross-section area of the copper pillars.

3. The method according to claim 1, wherein:
    a height of the copper pillars is in a range of 10 μm-90 μm; and
    a diameter of the copper pillars is in a range of 20 μm-150 μm.

4. The method according to claim 1, wherein a height of the solder material is in a range of 10 μm-45 μm.

5. The method according to claim 1, wherein the insulating layer includes multiple discrete sections with each section having openings to expose a portion of the electric leads.

6. The method according to claim 5, wherein the discrete sections of the insulating layer have a circular or square shape.

7. The method according to claim 1, wherein area of the openings is always larger than a cross-section area of corresponding copper pillars.

8. The method according to claim 1, wherein a thickness of the insulating layer is in a range of 5 μm-10 μm.

9. The method according to claim 1 further including forming a silver-containing layer to partially or entirely cover the electric leads on the leadframe prior to forming the insulating layer.

10. The method according to claim 9, wherein the silver-containing layer includes multiple discrete sections covering the electric leads with areas larger than or equal to areas of the openings to be formed in the insulating layer in a subsequent process and positions of the multiple discrete sections correspond to positions of the copper pillars.

11. The method according to claim 1, wherein the film layer formed on the non-active surface of the semiconductor chip is made of resin and a thickness of the film layer is no less than one third of a thickness of the semiconductor chip.

12. The method according to claim 1, further including: a cleaning process after back-flowing the solder material.

13. The method according to claim 12, further including:
    packaging at least one part of the semiconductor chip and the corresponding part of the leadframe to form one or more semiconductor packages after the cleaning process; and
    singualting the semiconductor packages from the leadframe after the packaging process.

14. A method for fabricating a flip-chip on leadframe (FCOL) semiconductor packaging structure, comprising:
    providing a semiconductor chip with a plurality of copper pillars formed over the semiconductor chip;
    forming a barrier layer on the copper pillar;
    coating a predetermined amount of solder material on the barrier layer;
    coating a layer of soldering flux on the solder material;
    providing a leadframe with electric leads formed on the leadframe;
    forming an insulating layer on the leadframe and having a plurality of openings, positioned corresponding to the copper pillars, to expose a portion of the electric leads;
    forming a tin-containing layer in the openings after forming the insulating layer;
    placing the semiconductor chip upside down onto the leadframe to have the soldering flux in contact with the portion of the electric leads exposed in the openings;
    flowing back the solder material to form conductive interconnections between the copper pillars and the portion of the electric leads exposed in the openings; and
    packaging the semiconductor chip with the leadframe using a mold compound.

15. The method according to claim 14, wherein a thickness of the tin-containing layer is less than a thickness of the insulating layer.

16. An FCOL semiconductor packaging structure, comprising:
    a semiconductor chip with a solder pad pattern formed on the semiconductor chip;
    a plurality of copper pillars formed on the solder pad pattern;
    a leadframe with electric leads formed on the leadframe;
    an insulating layer covering the leadframe, wherein the insulating layer includes a plurality of openings formed there-in with a portion of the electric leads exposed in each opening, a position of each opening corresponding to a position of a copper pillar, and an area of each opening is larger than a cross-section area of the corresponding copper pillar;

a plurality of solder interconnections with each solder interconnection located between a copper pillar and electric leads exposed in the corresponding opening of the copper pillar; and mold compound used to packaging the semiconductor chip, the plurality of copper pillars, the leadframe, the insulating layer, and the plurality of solder interconnections;

wherein the semiconductor chip comprising an exposed non-active surface after the packaging process, the exposed non-active surface of the semiconductor chip is ensured by coating a resin film layer on the non-active surface prior to the packaging process and then removing the resin film layer after the packaging process.

17. The FCOL semiconductor packaging structure according to claim 16, further including a silver-containing layer under the insulating layer to partially or entirely cover the electric leads on the lead frame.

18. The FCOL semiconductor packaging structure according to claim 16, further including a tin-containing layer formed in the openings of the insulating layer with a thickness smaller than that of the insulating layer.

* * * * *